(12) United States Patent
Kim

(10) Patent No.: US 7,560,370 B2
(45) Date of Patent: Jul. 14, 2009

(54) METHOD FOR MANUFACTURING SEMICONDUCTOR DEVICE

(75) Inventor: Seo Min Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 177 days.

(21) Appl. No.: 11/618,612

(22) Filed: Dec. 29, 2006

(65) Prior Publication Data

US 2007/0269971 A1 Nov. 22, 2007

(30) Foreign Application Priority Data

May 17, 2006 (KR) .................. 10-2006-0044221

(51) Int. Cl.
*H01L 21/44* (2006.01)
*H01L 21/28* (2006.01)
*H01L 21/3205* (2006.01)

(52) U.S. Cl. ...................... 438/598; 438/605

(58) Field of Classification Search .......... 257/296; 438/605, 656–657
See application file for complete search history.

(56) References Cited

U.S. PATENT DOCUMENTS

2004/0140495 A1* 7/2004 Uchiyama et al. ........... 257/296

FOREIGN PATENT DOCUMENTS

| KR | 101998048790 | 9/1998 |
|---|---|---|
| KR | 1020020039737 A | 5/2002 |
| KR | 1020030001562 A | 1/2003 |
| KR | 1020040006513 A | 1/2004 |

* cited by examiner

*Primary Examiner*—Ha Tran T Nguyen
*Assistant Examiner*—Valerie Brown
(74) *Attorney, Agent, or Firm*—Townsend and Townsend and Crew LLP

(57) ABSTRACT

A method for forming a semiconductor device includes forming a bit line contact region with a line pattern and then performing a process to form a bit line so that a multi-layered bit line contact is expended, thereby preventing a short between bit line contact plugs and improving the process margin of semiconductor devices and the reliability of semiconductor devices.

9 Claims, 6 Drawing Sheets

METHOD FOR MANUFACTURING SEMICONDUCTOR DEVICE

CROSS-REFERENCES TO RELATED APPLICATIONS

The present application claims priority to Korean patent application number 10-2006-0044221, filed on May 17, 2006, which is incorporated by reference in its entirety.

BACKGROUND OF THE INVENTION

The present invention relates to a method for manufacturing a semiconductor device, and more specifically, to a technology for forming a bit line contact region which prevents a short from occur between bit line contact plugs.

A bit line contact plug and a storage node contact plug are formed in an active region between gates of a semiconductor device. Due to the continual integration of semiconductor devices, the region between gates has become narrower and the process margin for forming a bit line contact plug and a storage node contact plug has been reduced.

SUMMARY OF THE INVENTION

Various embodiments are directed at providing a method for manufacturing a semiconductor device that includes forming a bit line contact region with a line pattern and then performing a process to form a bit line so that a multi-layered bit line contact is expanded, thereby preventing a short between bit line contact plugs and improving the process margin of semiconductor devices and the reliability of semiconductor devices.

According to an embodiment of the present invention, a method for manufacturing a semiconductor device comprises the steps of: forming a device separating film that defines an active region over a semiconductor substrate; forming a gate over the semiconductor substrate; forming a first interlayer insulating film over the semiconductor substrate and planarize the resulting structure; etching the first interlayer insulating film to expose the active region by an etching process with a mask including a line/space pattern taken along a lengthwise direction of the active region; filling the exposed semiconductor substrate with a first plug material and planarize the resulting structure; forming a second interlayer insulating film over the semiconductor substrate and planarize the resulting structure; etching the first and second interlayer insulating films by an etching process with a mask including a bit line contact pattern to form a bit line contact hole; and filling the bit line contact hole.

DESCRIPTION OF THE EMBODIMENTS

The present invention will be described in detail with reference to the accompanying drawings.

Figure 1A:
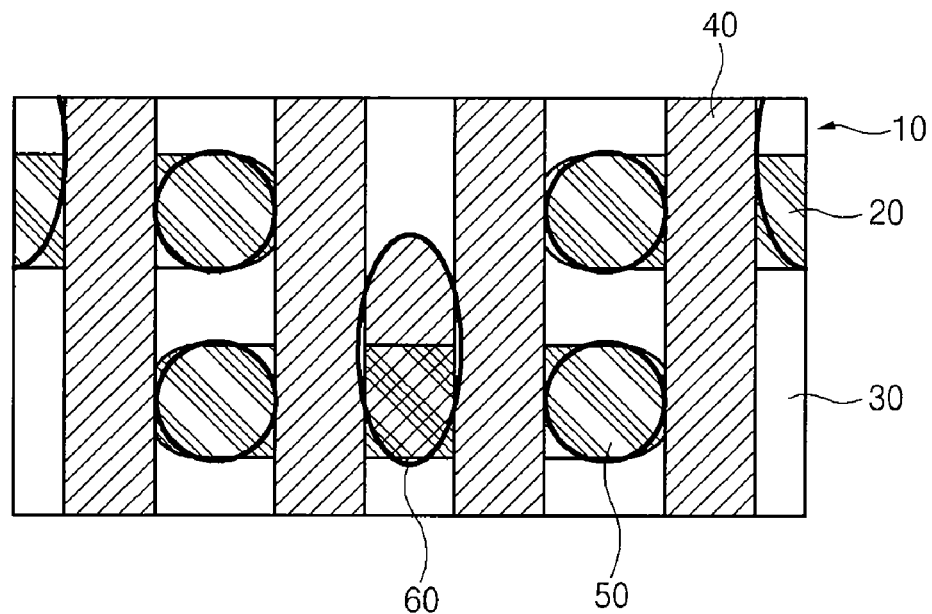
FIGS. 1a and 1b are diagrams illustrating a conventional method for forming a bit line contact plug and a storage node contact plug.
Figure 1B:
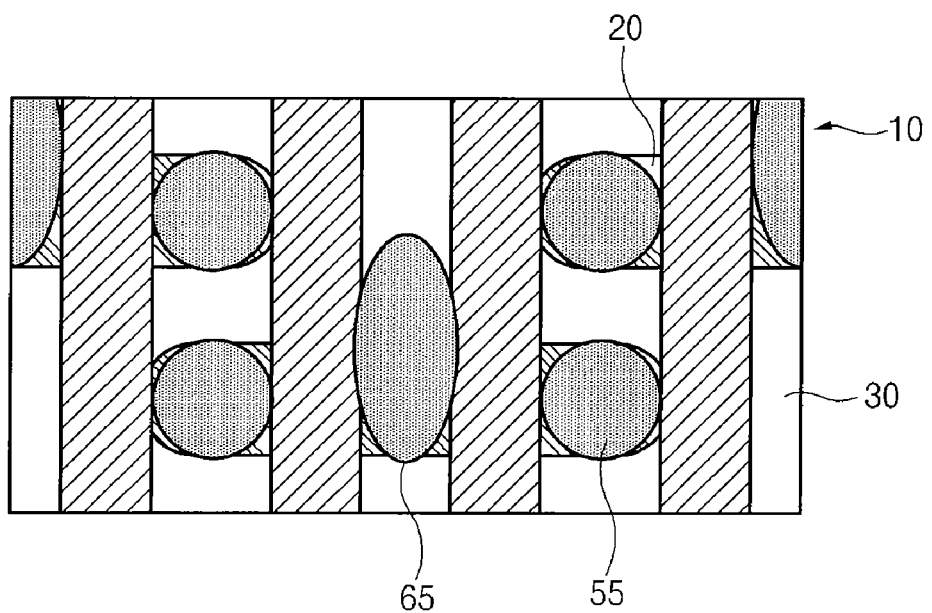

Referring to FIGS. 1a and 1b, in the conventional method, a device isolation structure 30 that defines an active region 20 is formed over a semiconductor substrate 10, and a gate 40 is formed thereover.

A storage node contact hole 50 is formed in both edge portions of the 3-divided active region 20 by the gate 40, and a bit line contact hole 60 is formed in the center of the active region 20. The bit line contact hole 60 is formed in an oval shape in order to improve the electric characteristic and the process margin of a semiconductor device.

A polysilicon layer is filled in the storage node contact hole 50 and the bit line contact hole 60 to form a storage node contact plug 55 and a bit line contact plug 65

As a semiconductor device becomes smaller, the contact holes become smaller so that the process margin is reduced.

Figure 2A:
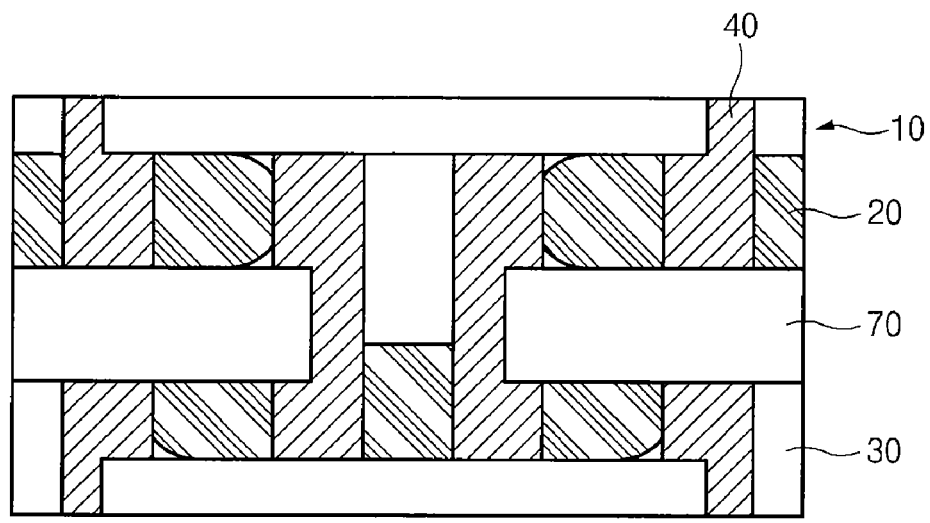
FIGS. 2a and 2b are diagrams illustrating a conventional method for forming a landing plug contact.
Figure 2B:
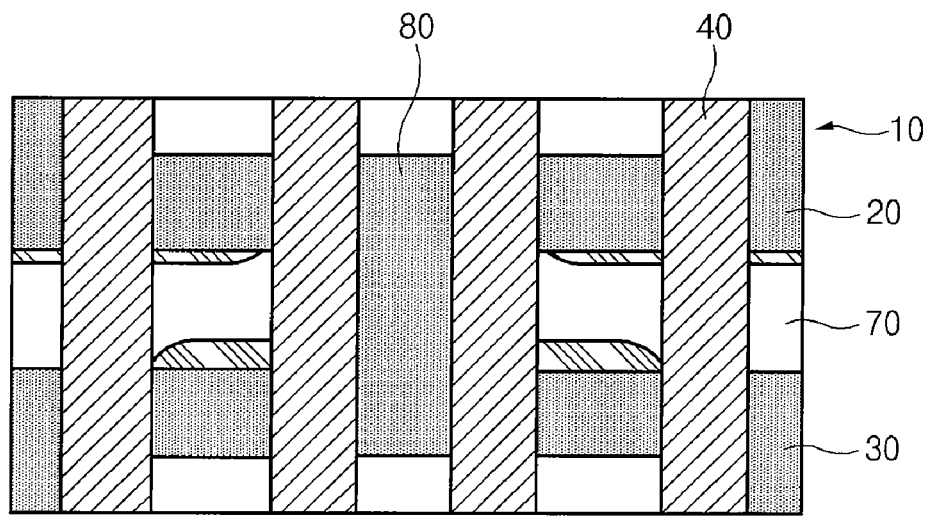

Referring to FIGS. 2a and 2b, a mask pattern for exposing a storage node contact region, a bit line contact region and a given gate region of the active region 20 is formed so that a bit line contact hole and a storage node contact hole are formed at the same time. The bit line contact hole and the storage node contact hole are combined, which is called a landing plug contact hole. A mask pattern for exposing a landing plug contact hole is a landing plug contact mask 70.

A polysilicon layer is filled in the landing plug contact hole to form a landing plug contact 80.

Although the method using a landing plug contact mask improves the margin for forming a contact hole, a short between bit line contact plugs can occur.

Figure 3:
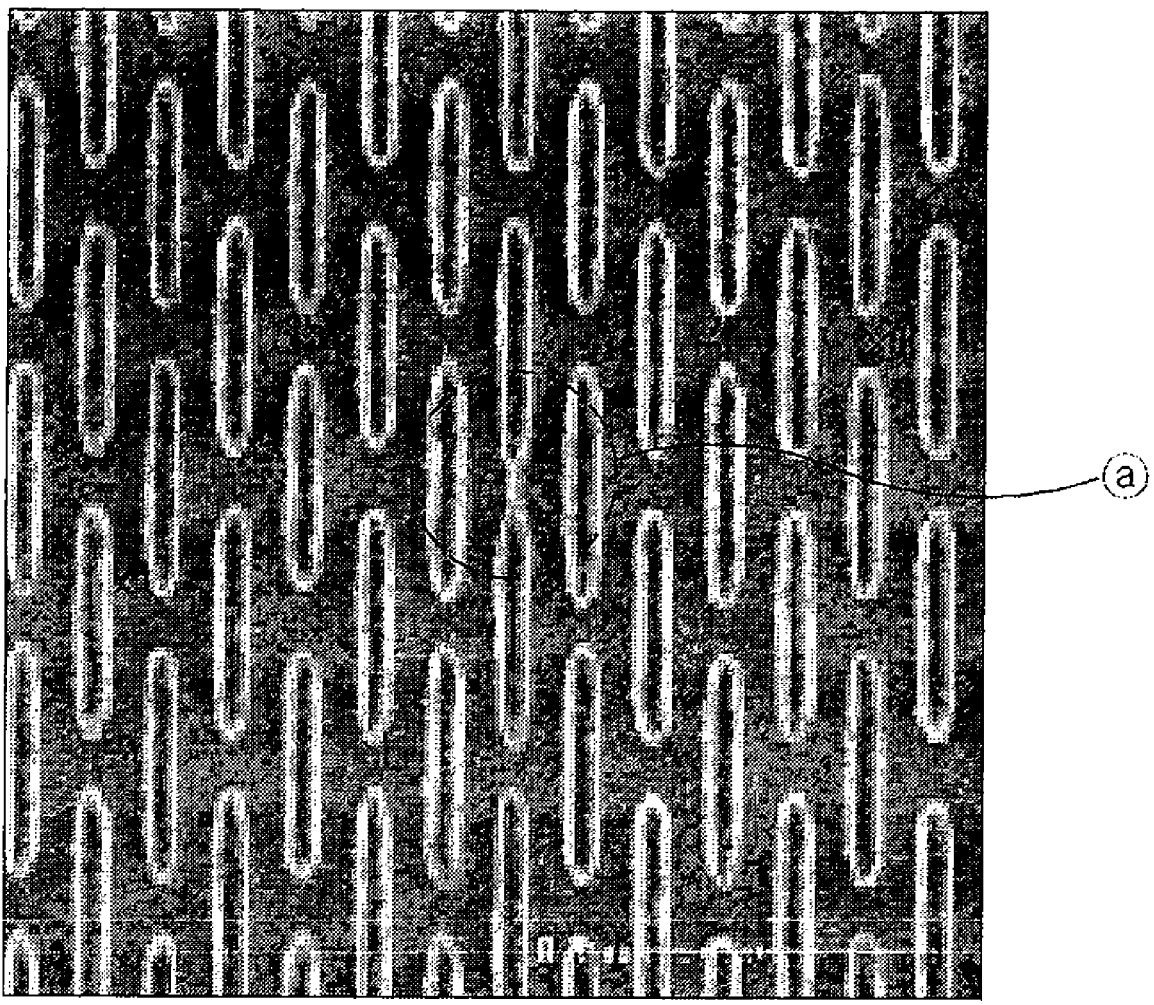
FIG. 3 is a photograph illustrating a shorted bit line contact plug.

Referring to FIG. 3, the micrograph shows a short is generated in the lengthwise direction of the oval bit line contact plug (see region (a)).

As mentioned above, in the conventional method for forming a storage node contact and a bit line contact, the process margin is reduced due to high integration of semiconductor devices, which increases defects and reduces the reliability of semiconductor devices.

The following illustrates a method for manufacturing a semiconductor device according to an embodiment of the present invention. Referring to FIGS. 4a through 4f, a device isolation structure 130 is formed which defines a bar-type active region 120 over a semiconductor substrate 100. The device separating film 130 is formed by a Shallow Trench Isolation (STI) process (see FIG. 4a).

Figure 4A:
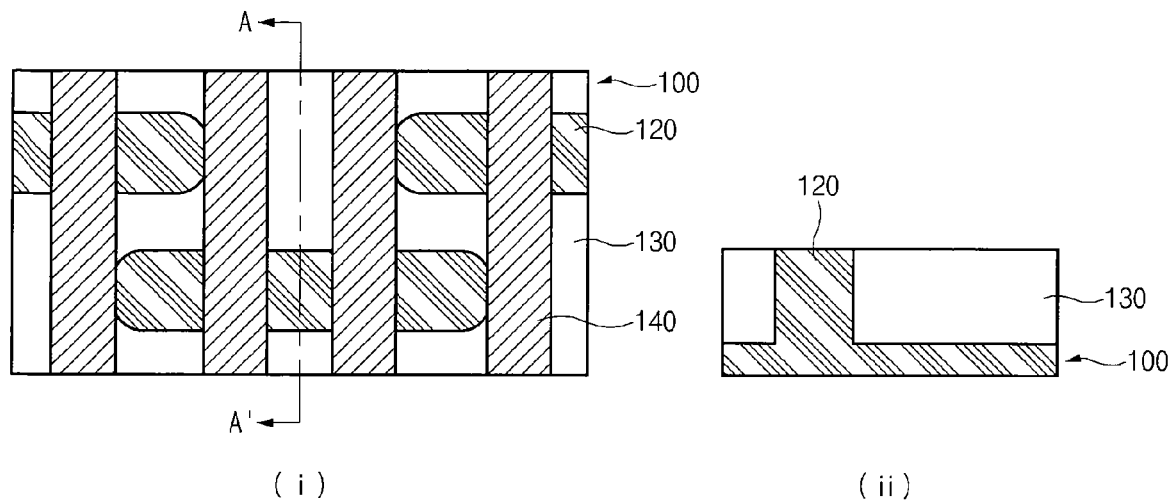
FIGS. 4a through 4f are diagrams illustrating a method for manufacturing a semiconductor device according to an embodiment of the present invention.

A gate oxide film (not shown), a polysilicon layer (not shown), a metal layer (not shown) and a hard mask layer (not shown) are formed over the semiconductor substrate 100. A gate 140 is formed perpendicular to the lengthwise direction of the active region 120. The gate 140 is formed by an etching process that uses a gate mask (not shown) to expose the storage node region and the bit line contact region. FIG. 4a(ii) illustrates a cross section taken along A-A at a region between gates.

Figure 4B:
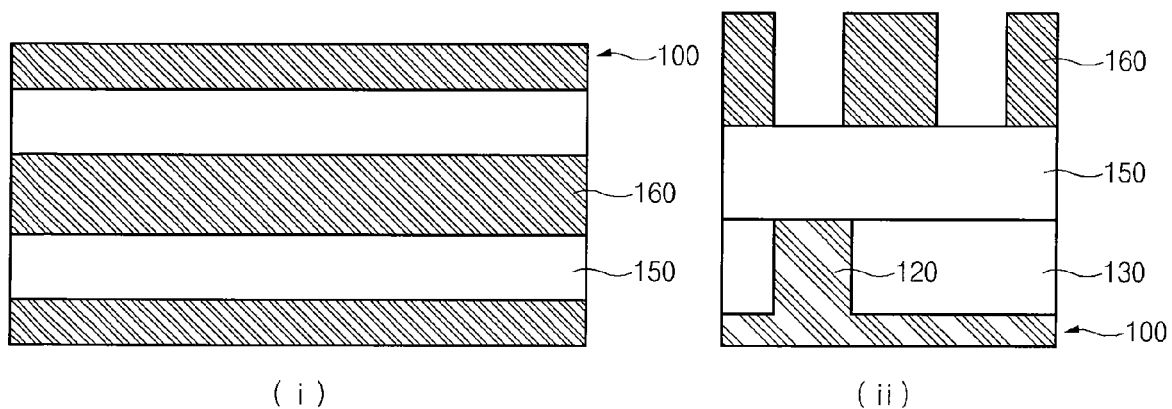

FIG. 4b shows a first interlayer insulating film (or first insulating film) 150 is formed over the semiconductor substrate 100 and planarized. A photoresist film (see numeral 160) is formed over the first interlayer insulating film 150. A first photoresist pattern 160 is formed by an exposure and etching process using a mask including a line/space pattern provided along the direction of the active region 120 to expose a portion of the first interlayer insulating film 150 directly overlying the active region.

Figure 4C:
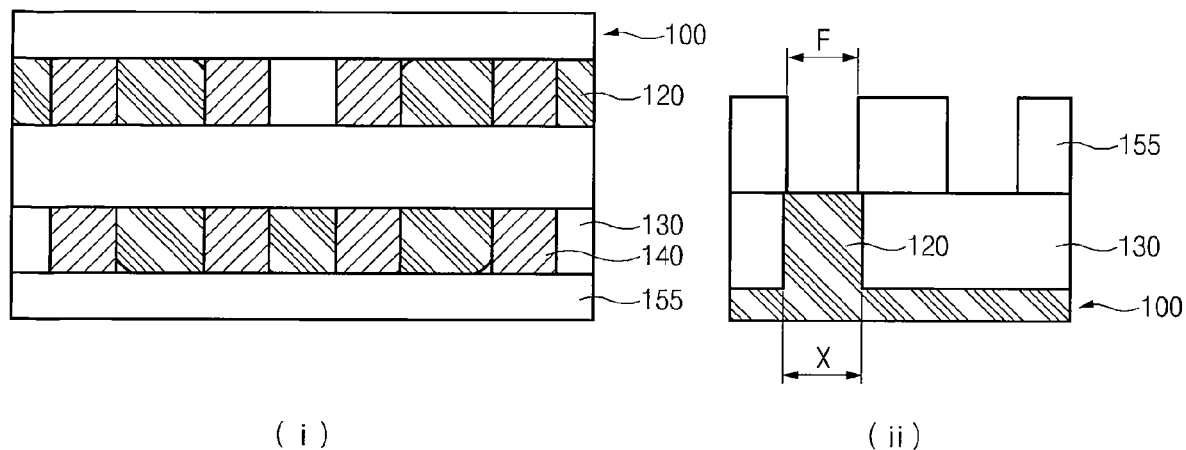

The first interlayer insulating film 150 is etched using the first photoresist pattern 160 as an etching mask to form a first interlayer insulating film line/space pattern 155 for exposing the active region 120 (see FIG. 4c). The etching-the-interlayer-insulating-film step is performed by a Self Alignment Contact (SAC) process using the first photoresist pattern 160.

The first photoresist pattern 160 is removed. If line-width of the space pattern for exposing the active region 120 is designated 'F' and the line-width of the active region 120 is designated 'X' in (FIG. 4c(ii)), then the line/space pattern 155 is formed to be $0.5X \leq F \leq 0.9X$.

Figure 4D:
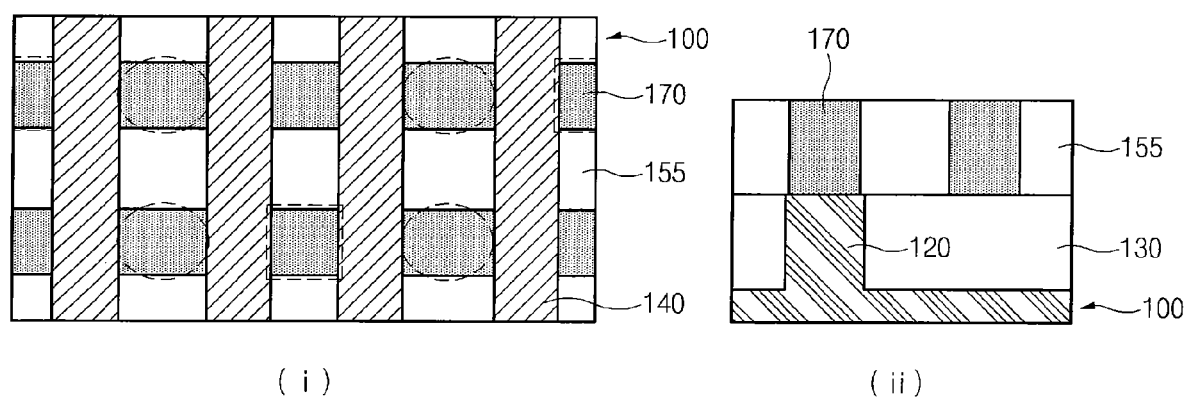

Referring to FIG. 4d, the exposed semiconductor substrate 100 is filled with a first plug material 170, and planarized to separate the storage node contact region 170a from the bit line contact region 170b. The first plug material 170 is selected from polysilicon, tungsten or aluminum.

Figure 4E:
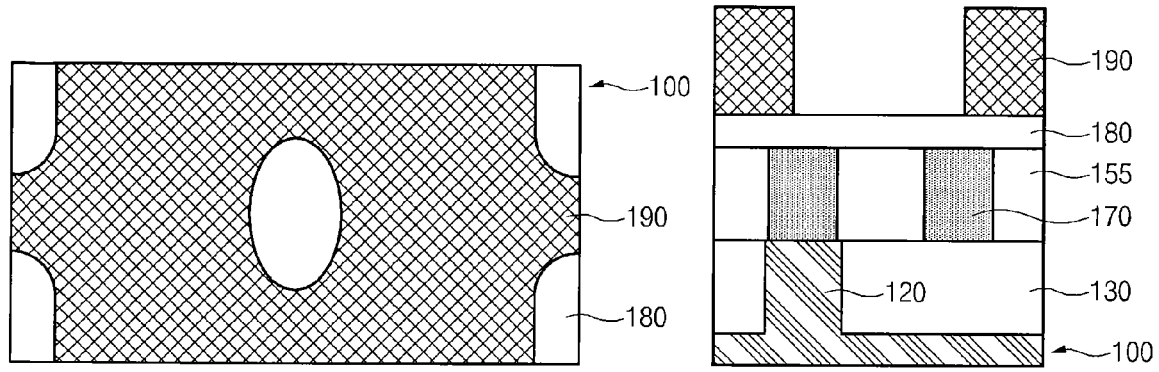
Figure 4F:
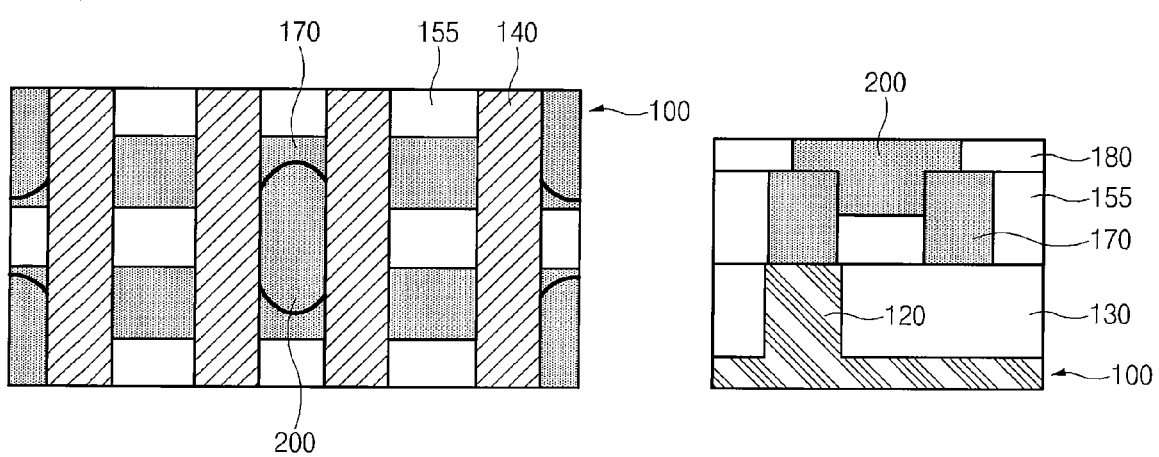

Referring to FIG. 4e, a second interlayer insulating film (or second insulating film) 180 is formed over the semiconductor substrate 100 and planarized. A photoresist film is formed over the second interlayer insulating film. An exposure and etching process is performed with a mask including a bit line contact pattern to form a second photoresist pattern 190. The bit line contact patterns are formed in circular and oval shapes.

A SAC process is performed with the second photoresist pattern 190 as an etching mask to etch the second interlayer insulating film 180 and the line/space pattern 155 so that a bit line contact hole is formed. The SAC process is performed until a trench is formed over the line/space pattern 155. In the present implementation, the etching is performed until the line/space pattern 155 has been etched to a half of its thickness in consideration of the process margin (see FIG. 4f).

The second photoresist pattern 190 is removed, and a process for forming a bit line (not shown) is performed to fill a bit line contact hole. The bit line (not shown) may be formed at the time the bit line contact plug is formed by filling the bit line contact hole with a bit line material 200. Alternatively, the bit line may be formed after the bit line contact plug has been formed by filling the bit line contact hole with the bit line material 200 and then planarized. The second plug material is selected from polysilicon, tungsten or aluminum.

As described above, according to an embodiment of the present invention, a method for forming a semiconductor device includes forming a bit line contact region with a line pattern and then performing a process to form a bit line that has a multi-layered bit line, thereby preventing a short between bit line contact plugs and improving the process margin of semiconductor devices and the reliability of the semiconductor device.

The aforementioned embodiments of the present invention are illustrative and not limitative. Various alternatives and equivalents are possible. The invention is not limited by the type of deposition, etching polishing, and patterning steps described herein. Nor is the invention limited to any specific type of semiconductor devices. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for manufacturing a semiconductor device, the method comprising the following steps:
    forming gates over a semiconductor substrate;
    forming a first insulating film over the semiconductor substrate;
    etching the first insulating film in a line/space pattern along a lengthwise direction of an active region to expose the active region and a device isolation region between the gates;
    forming a first plug material and a second plug material over the exposed active region and device isolation region;
    forming a second insulating film over the first insulating film, the first plug material and the second plug material;
    etching the first and second insulating films between the first and second plug materials to expose the first plug material over the device isolation region and the second plug material over a bit line contact region of the active region to form a bit line contact hole; and
    filling the bit line contact hole with a third plug material.

2. The method according to claim 1, wherein the etching-the-first-interlayer-insulating-film step is characterized in $0.5X \leq F \leq 0.9X$, where F is a line-width of a space pattern for exposing the semiconductor substrate, and X is a line-width of the active region.

3. The method according to claim 1, wherein the etching-the-first-insulating-film is performed by a Self Alignment Contact ("SAC") process.

4. The method according to claim 1, wherein the first and second plug material includes polysilicon, tungsten, aluminum, or a combination thereof.

5. The method according to claim 1, wherein the etching-the-first-and-second-insulating-films step involves a SAC process.

6. The method according to claim 5, wherein the SAC process is performed until a thickness of the first insulating film is reduced by half.

7. The method according to claim 1, wherein the bit line contact hole is formed to have a non-angular shape.

8. The method according to claim 1, further comprising forming a bit line for connecting the third plug material in adjacent bit line contact holes.

9. The method according to claim 1, wherein the third plug material includes polysilicon, tungsten, aluminum, or a combination thereof.

* * * * *